(12) United States Patent
Veendrick et al.

(10) Patent No.: US 7,616,051 B2
(45) Date of Patent: Nov. 10, 2009

(54) INTEGRATED CIRCUIT, ELECTRONIC DEVICE AND INTEGRATED CIRCUIT CONTROL METHOD

(75) Inventors: Hendricus J. M. Veendrick, Heeze (NL); Atul Katoch, Kanata (CA)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/911,881

(22) PCT Filed: Apr. 20, 2006

(86) PCT No.: PCT/IB2006/051219

§ 371 (c)(1), (2), (4) Date: Jun. 3, 2008

(87) PCT Pub. No.: WO2006/111932

PCT Pub. Date: Oct. 26, 2006

(65) Prior Publication Data

US 2008/0284491 A1    Nov. 20, 2008

(30) Foreign Application Priority Data

Apr. 22, 2005    (EP)    .................................. 05103277

(51) Int. Cl.
   *G05F 1/10*    (2006.01)
   *H03K 17/16*    (2006.01)
(52) U.S. Cl. ......................................... 327/544; 326/34
(58) Field of Classification Search .................. 327/544, 327/530, 384, 538; 326/121, 119, 34
See application file for complete search history.

(56) References Cited

U.S. PATENT DOCUMENTS

| | | | |
|---|---|---|---|
| 5,378,940 A | 1/1995 | Knight | |
| 5,493,240 A | 2/1996 | Frank | |
| 6,208,170 B1 * | 3/2001 | Iwaki et al. | 326/121 |
| 6,329,874 B1 * | 12/2001 | Ye et al. | 327/544 |
| 7,138,825 B2 * | 11/2006 | Kim et al. | 326/34 |
| 7,196,954 B2 * | 3/2007 | Suh | 365/207 |
| 7,414,460 B1 * | 8/2008 | Lien et al. | 327/544 |
| 2004/0239368 A1 | 12/2004 | Nautiyal | |

* cited by examiner

*Primary Examiner*—Dinh T. Le

(57) ABSTRACT

An integrated circuit (10) comprises a plurality of functional blocks (101, 102, 103), each of the functional blocks (101, 102, 103) being coupled between a first power supply line (110) and a second power supply line (120). A first functional block (101) is coupled to the first power supply line (110) via a first conductive path including a first switch (131) and a second functional block (102) is coupled to the first power supply line (110) via a second conductive path including a second switch (132), the first switch (131) and the second switch (132) being arranged to respectively disconnect the first functional block (101) and the second functional block (102) from the first power supply line (110) for switching said functional blocks (101, 102) from an active mode to a standby mode. The IC (10) comprises a further switch (141) having a first terminal coupled to a node (121) of the first conductive path between the first switch (131) and the first functional block (101) and a second terminal coupled to a node (122) of the second conductive path between the second switch (132) and the second functional block (102). The further switch (141) has a control terminal responsive to an enable signal indicating that the first switch (131) and the second switch (132) are disabled, thus allowing the recycling of charge between the first functional block (101) and the second functional block (102).

7 Claims, 2 Drawing Sheets

INTEGRATED CIRCUIT, ELECTRONIC DEVICE AND INTEGRATED CIRCUIT CONTROL METHOD

The invention relates to an integrated circuit (IC) comprising a plurality of functional blocks, each of the functional blocks being coupled between a first power supply line and a second power supply line, a first functional block being coupled to the first power supply line via a first conductive path including a first switch and a second functional block being coupled to the first power supply line via a second conductive path including a second switch, the first switch and the second switch being arranged to respectively disconnect the first functional block and the second functional block from the first power supply for switching said functional blocks from an active mode to a standby mode.

The invention further relates to an electronic device having such an IC.

The invention also relates to a charge recycling method for such an IC.

One of the biggest challenges associated with the design of contemporary ICs is the power consumption management of the IC. Due to the high feature density and miniaturization of the feature sizes on the IC, such an IC draws large currents from an associated power supply during active mode, which can cause overheating of the IC as well as quickly drain the power supply when the latter has limited capacity, e.g. a battery pack.

The power consumption of an IC can be limited by disconnecting its functional blocks from the power supply when the functional blocks have entered a sleep or a standby mode, because this significantly reduces the magnitude of the leakage current associated with such a functional block. However, the power-up of such a functional block when it switches back to an active mode imposes a large drain on the power supply, which can cause a large temporary drop in supply voltage and a large interference to neighbouring chips on the same board. This jeopardizes the correct functioning of other functional blocks and/or ICs that are already active.

US patent application US2004/0239368 provides a solution to this problem by disclosing an IC having a plurality of functional blocks, with each functional block being provided with a charge redistribution circuit having a mode transition detector, with each charge redistribution circuit being connected to a capacitive intermediate floating virtual source/sink upon detection of a transition to an idle mode of the associated functional block. The charge stored in the capacitive virtual source/sink can be reused to charge other functional blocks, thus relieving some of the strain on the power supply.

However, this IC has the disadvantage that the charge recycling measures introduce a significant area overhead to the IC.

The present invention seeks to provide an IC according to the opening paragraph having a simplified charge recycling facility.

The present invention further seeks to provide an electronic device including such an IC.

The present invention also seeks to provide a method for recycling charge in such an IC.

According to an aspect of the invention, there is provided an IC according to the opening paragraph, the IC further comprising a further switch having a first terminal coupled to a node of the first conductive path between the first switch and the first functional block and a second terminal coupled to a node of the second conductive path between the second switch and the second functional block, the further switch having a control terminal responsive to an enable signal indicating that the first switch and the second switch are disabled.

The invention is based on the realization that ICs increasingly comprise mutually exclusive, or complementary, functionalities, e.g. a first functional block that is only active when a second functional block is in a standby mode and vice versa. Consequently, the charge stored in the functional block going to standby mode can be recycled into the functional block going to active mode without the need for dedicated charge storage devices.

In an embodiment, the integrated circuit further comprises a controller for generating the enable signal. Preferably, this is same controller that controls the mode selection of the functional blocks, which has the advantage that no dedicated functionality is required for generating the enable signal.

Alternatively, the integrated circuit further comprises a first line coupled to a control terminal of the first switch, a second line coupled to a control terminal of the second switch and a logic gate having a first input coupled to the first line, a second input coupled to the first line and an output for generating the enable signal. This has the advantage that the enable signal can be generated in the vicinity of the further switch without the need for lengthy conductors between a global controller and the control terminal of the further switch.

According to another aspect of the invention, there is provided an electronic device comprising an integrated circuit as claimed in claim 1 and a power supply being coupled between the first power supply line and the second power supply line of the integrated circuit. Such an electronic device benefits from an IC according to the present invention, because its power supply has to provide less power to the IC on power-up and power-down of functional blocks compared to conventional ICs without charge recycling facilities. This is particularly relevant if the power supply comprises a battery.

According to yet another aspect of the invention, there is provided a method for recycling charge stored in an IC according to the opening paragraph, the method comprising providing a further switch having a first terminal coupled to a node of the first conductive path between the first switch and the first functional block and a second terminal coupled to a node of the second conductive path between the second switch and the second functional block; disabling the first switch to disconnect the first functional block from the first power supply line to switch the first functional block from an active mode to a standby mode; if the second switch is disabled, enabling the further switch for a predefined time period to enable a charge transfer from the first functional block to the second functional block; disabling the further switch after the predetermined time period; preferably completed by enabling the second switch after disabling the further switch to connect the second functional block to the first power supply line to switch the second functional block from a standby mode to an active mode.

With this method, ground and supply bounce in an IC and its power consumption are reduced.

The invention is described in more detail and by way of non-limiting examples with reference to the accompanying drawings, wherein.

It should be understood that the Figures are merely schematic and are not drawn to scale. It should also be understood that the same reference numerals are used throughout the Figures to indicate the same or similar parts.

Figure 1:
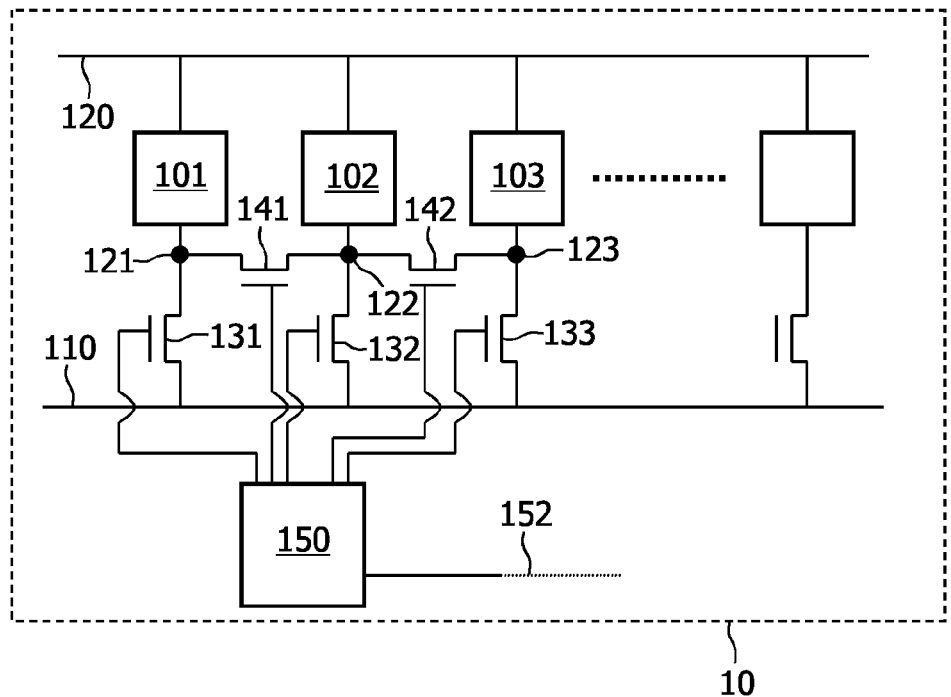
FIG. 1 depicts an embodiment of an IC of the present invention.

FIG. 1 shows an IC 10 having a plurality of functional blocks including functional blocks 101, 102 and 103. The functional blocks are coupled between a first power supply line 110, e.g. the supply voltage ($V_{dd}$) line, and a second power supply line 120, e.g. ground, with each functional block being coupled to the first power supply line 110 through a conductive path including an enable switch, e.g. first functional block 101 is coupled to the first power supply line 110 through a conductive path including first switch 131, second functional block 102 is coupled to the first power supply line 110 through a second conductive path including second switch 132 and so on.

The conductive paths of a number of functional blocks are interconnected via further switches. For instance, a further switch 141 has a first terminal coupled to node 121 of the first conductive path and a second terminal coupled to node 122 of the second conductive path, and a fourth enable switch 142 has a first terminal coupled to node 122 of the second conductive path and a second terminal coupled to node 123 of the third conductive path, i.e. the path between the third functional block 103 and the first power supply line 110, which includes a third switch 133, and so on. It is pointed out that not all functional blocks have to be interconnected; some functional blocks may lack such an interconnection, for instance because they are simultaneously active for most of the operational time of the IC 10. The switches shown in FIG. 1 may be any suitable type of switch, e.g. MOS, CMOS, BiCMOS or bipolar transistors, thyristors and so on.

A controller 150 is arranged to control the control terminals of aforementioned switches, i.e. the switches 131, 132, 133 and the further switches 141 and 142 shown in FIG. 1. The controller 150 is configured to switch the functional blocks 101, 102, 103 of the IC 10 between an active mode and a standby mode, which may be in response to an external signal 152, e.g. a user-defined signal, or which may be internally determined. Upon determining that a functional block, say first functional block 101, has to be switched to a standby mode, the controller 150 disables the associated switch 131 in the first conductive path of first functional block 101 to the first power supply line 110, thus disconnecting first functional block 101 from the power supply.

Next, the controller 150 checks if a functional block that is coupled via its conductive path to the first conductive path of the first functional block 101 via a further switch, e.g. the second conductive path of the second functional block 102 being coupled to the first conductive path of the first functional block 101 via the further switch 141, is in a standby mode, i.e. having its associate second switch 132 disabled. If this is the case, the controller 150 will enable the first further switch 141 to allow charge from the charged first functional block 101 to flow to the uncharged second functional block 102.

Preferably, the controller 150 only enables the first further switch 141 if the controller 150 has determined that the second functional block 102 has to be activated, although the first further switch may also be enabled when both functional blocks remain in standby mode; this only causes the charge of the first functional block 101 to also leak away via the second functional block 102. Subsequently, if the second functional block 102 is to switch to an active mode, the controller 150 enables the second switch 132, thus connecting the second functional block 102 to the first power supply line 110. The second switch 132 is enabled after a predetermined delay to ensure that the charge stored in the first functional block 101 has evenly distributed over the first functional block 101 and the second functional block 102. When the second switch 132 is enabled, the further switch 141 is disabled again to ensure that the first functional block 101 remains disconnected from the power supply line 110.

The further switches 141, 142 may also be simultaneously enabled in a cascaded manner; for instance, when first functional block 101 and second functional block 102 simultaneously switch to standby, with third functional block being scheduled to switch to an active mode, both first further switch 141 and second further switch 142 may be enabled to allow the combined charge of first functional block 101 and second functional block 102 to flow to third functional block 103.

Figure 2:
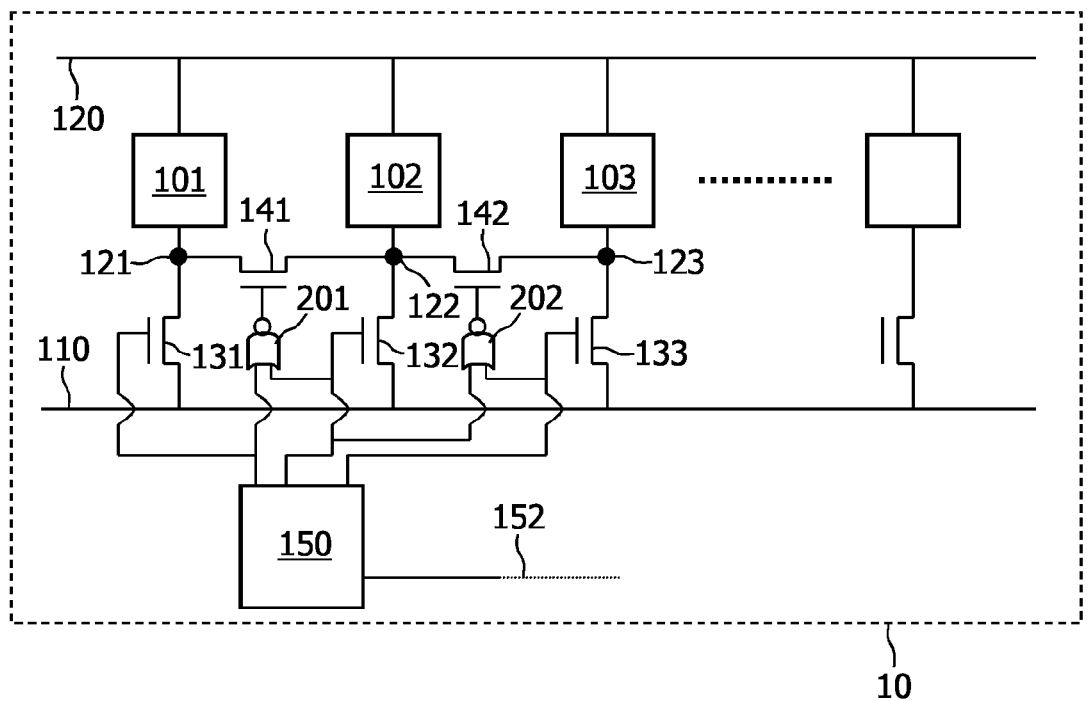
FIG. 2 depicts another embodiment of an IC of the present invention.

FIG. 2 shows an alternative embodiment of IC 10 of the present invention. In this embodiment, the further switches 141, 142 are enabled by respective logic gates 201, 202. First logic gate 201 has a first input coupled to the enable line of the first switch 131 and a second input coupled to the enable line of the second switch 132, and second logic gate 202 has a first input coupled to the enable line of the second switch 132 and a second input coupled to the enable line of the third switch 133. If for instance the second functional block 102 is in a standby mode, and controller 150 switches off the first switch 131 to force the first functional block 101 in a standby mode, the logic gate 201 automatically enables the first further switch 141 via its output because the logic states of the enable lines of the first switch 131 and the second switch 132 correspond with these switches being disabled. In the case of the first switch 131, the second switch 132 and the first further switch 141 being disabled by a logic zero, e.g. said switches being nMOS transistors, the logic gate 201, the logic gate 201 would be implemented as a NOR gate.

In case of the second functional block 102 being scheduled to be switched to an active mode upon the first functional block 101 being switched to a standby mode, the controller 150 is configured to enable the second switch 132 a predefined time period after disabling the first switch 131 to allow the charge from the first functional block 101 to be redistributed to the second functional block 102. The activation of the second switch 132 will automatically disable the first further switch 141 because first logic gate 201 will receive a change in one of is input values, causing the first logic gate 201 to change its output value, thus disabling the first further switch 141.

The embodiments of IC 10 depicted in FIG. 1 and FIG. 2 implement the method of the present invention. The provision of a further switch 141 having a first terminal coupled to a node 121 of the first conductive path between the first switch 131 and the first functional block 101 and a second terminal coupled to a node 122 of the second conductive path between the second switch 132 and the second functional block 102 allows for the redistribution of charge from the first functional block 101 to the second functional block 102 by disabling the first switch 131 to disconnect the first functional block 101 from the first power supply line 110 to switch the first functional block 101 from an active mode to a standby mode, and, if the second switch is disabled, the subsequent steps of enabling the further switch 141 for a predefined time period to enable a charge transfer from the first functional block 101 to the second functional block 102, disabling the further switch 141 after the predetermined time period, and enabling the second switch 132 after disabling the further switch 141 to connect the second functional block 102 to the first power supply line 110 to switch the second functional block 102 from a standby mode to an active mode.

Figure 3:
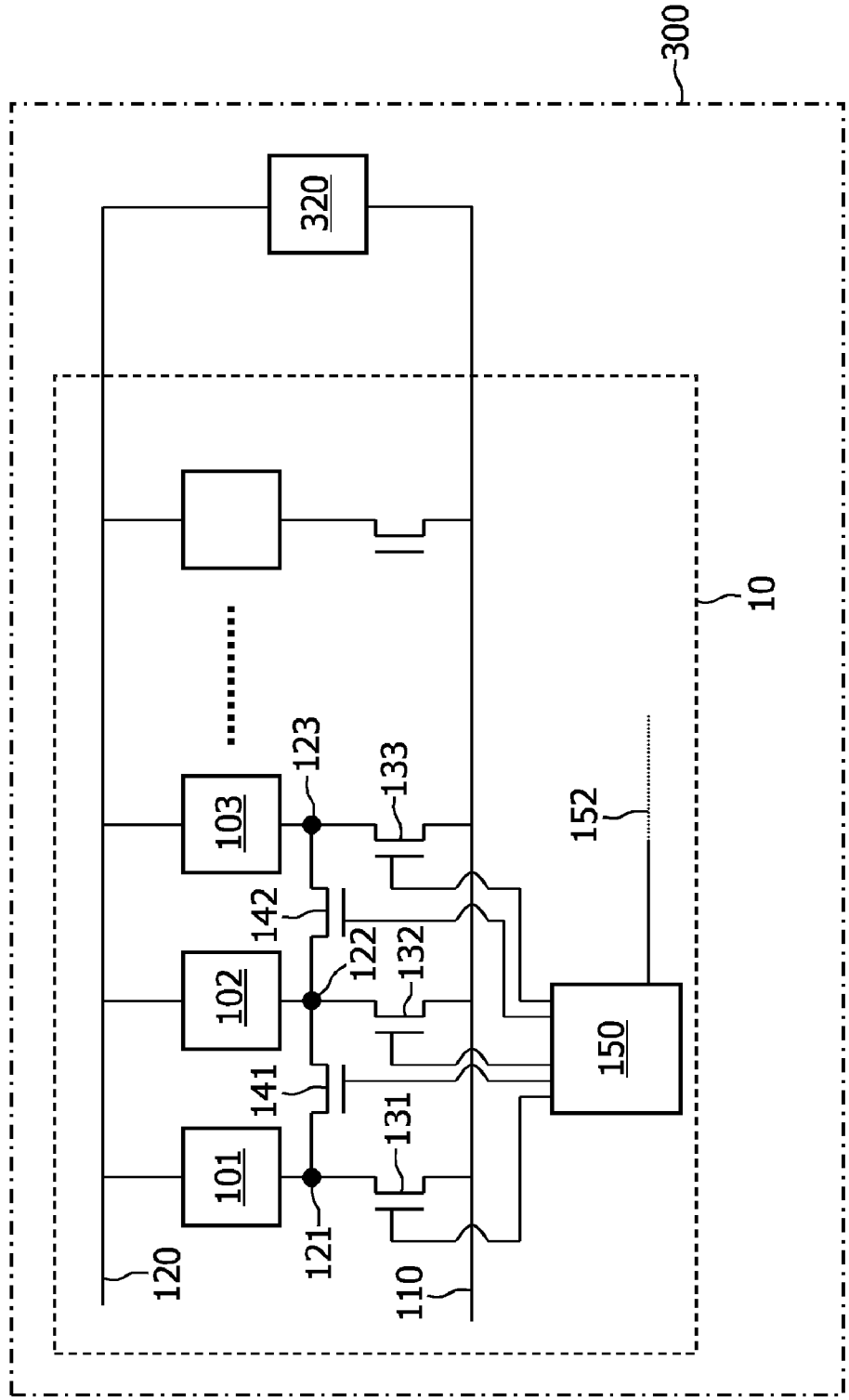
FIG. 3 depicts an electronic device of the present invention.

FIG. 3 shows an electronic device 300 having an IC 10 according to the present invention. The electronic device 300 has a power supply 320, e.g. a battery or a mains powered device, coupled between the first power supply line 110 and the second power supply line 120 of the IC 10 for powering the functional blocks of IC 10. The electronic device 300 benefits from a reduction in supply bounce, and longer lasting battery power in case of the power supply 320 comprising a battery, due to the presence of the charge recycling measures on board the IC 10. This improves the performance and reliability of the electronic device 300 as a whole.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit comprising:
    a plurality of functional blocks, each of the functional blocks being coupled between a first power supply line and a second power supply line, a first functional block being coupled to the first power supply line via a first conductive path including a first switch and a second functional block being coupled to the first power supply line via a second conductive path including a second switch, the first switch and the second switch being arranged to respectively disconnect the first functional block and the second functional block from the first power supply line for switching said functional blocks from an active mode to a standby mode; and
    a further switch having a first terminal coupled to a node of the first conductive path between the first switch and the first functional block and a second terminal coupled to a node of the second conductive path between the second switch and the second functional block, the further switch having a control terminal that is responsive to an enable signal from a controller.

2. An integrated circuit as claimed in claim 1, wherein the integrated circuit further comprises a controller for generating the enable signal.

3. An integrated circuit as claimed in claim 1, further comprising a first enable line coupled to a control terminal of the first switch, a second enable line coupled to a control terminal of the second switch and a logic gate having a first input coupled to the first enable line, a second input coupled to the second enable line and an output for generating the enable signal.

4. An electronic device comprising: an integrated circuit as claimed in claim 1; and a power supply being coupled between the first power supply line and the second power supply line of the integrated circuit.

5. An electronic device as claimed in claim 4, wherein the power supply comprises a battery.

6. A method for recycling charge stored in an integrated circuit comprising a plurality of functional blocks, each of the functional blocks being coupled between a first power supply line and a second power supply line, a first functional block being coupled to the first power supply line via a first conductive path including a first switch, and a second functional block being coupled to the first power supply line via a second conductive path including a second switch; the method comprising:
    providing a further switch having a first terminal coupled to a node of the first conductive path between the first switch and the first functional block and a second terminal coupled to a node of the second conductive path between the second switch and the second functional block;
    disabling the first switch to disconnect the first functional block from the first power supply line to switch the first functional block from an active mode to a standby mode;
    if the second switch is disabled, enabling the further switch for a predefined time period to enable a charge transfer from the first functional block to the second functional block; and
    disabling the further switch after the predetermined time period.

7. A method as claimed in claim 5, further comprising enabling the second switch after disabling the further switch to connect the second functional block to the first power supply line to switch the second functional block from a standby mode to an active mode.

* * * * *